United States Patent
Eom et al.

(10) Patent No.: US 12,160,946 B2
(45) Date of Patent: Dec. 3, 2024

(54) IMAGE SENSOR PACKAGE AND CAMERA DEVICE INCLUDING SAME

(71) Applicant: LG INNOTEK CO., LTD., Seoul (KR)

(72) Inventors: Seong Su Eom, Seoul (KR); Sol Ip Lee, Seoul (KR); Hee Jung Lee, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 166 days.

(21) Appl. No.: 17/922,632

(22) PCT Filed: May 6, 2021

(86) PCT No.: PCT/KR2021/005663
§ 371 (c)(1),
(2) Date: Nov. 1, 2022

(87) PCT Pub. No.: WO2021/235744
PCT Pub. Date: Nov. 25, 2021

(65) Prior Publication Data
US 2023/0171874 A1 Jun. 1, 2023

(30) Foreign Application Priority Data

May 20, 2020 (KR) .................. 10-2020-0060470
May 20, 2020 (KR) .................. 10-2020-0060471

(51) Int. Cl.
*H05K 1/02* (2006.01)
*H04N 23/50* (2023.01)
*H05K 1/11* (2006.01)

(52) U.S. Cl.
CPC ........... *H05K 1/0206* (2013.01); *H04N 23/50* (2023.01); *H05K 1/113* (2013.01)

(58) Field of Classification Search
CPC ....... H05K 1/0206; H05K 2201/10121; H05K 2201/10151; H05K 1/0209
See application file for complete search history.

(56) References Cited

U.S. PATENT DOCUMENTS

2018/0084647 A1* 3/2018 Nalla .................. H05K 3/4697
2019/0246490 A1 8/2019 Li et al.

FOREIGN PATENT DOCUMENTS

JP      2006-191465        7/2006
KR      10-2011-0127913    11/2011
(Continued)

OTHER PUBLICATIONS

International Search Report dated Aug. 24, 2021 issued in Application No. PCT/KR2021/005663.
(Continued)

*Primary Examiner* — Sherman Ng
(74) *Attorney, Agent, or Firm* — KED & ASSOCIATES, LLP

(57) ABSTRACT

A camera device according to one embodiment of the present invention includes a printed circuit board, a heat radiation layer disposed on a first surface of the printed circuit board, and an image sensor disposed on the heat radiation layer, a plurality of through-holes passing through the printed circuit board from the first surface to a second surface which is a surface opposite to the first surface are formed in the printed circuit board, and the plurality of through-holes are in contact with the heat radiation layer.

18 Claims, 9 Drawing Sheets

(56) References Cited

FOREIGN PATENT DOCUMENTS

| KR | 10-2012-0017242 | 2/2012 |
|----|-----------------|--------|
| KR | 10-2015-0098422 | 8/2015 |
| KR | 10-2016-0061242 | 5/2016 |
| KR | 10-2016-0147465 | 12/2016 |

OTHER PUBLICATIONS

Korean Office Action dated Jul. 2, 2024 issued in Application No. 10-2020-0060470.
Korean Office Action dated Jul. 3, 2024 issued in Application No. 10-2020-0060471.

* cited by examiner

[FIG. 1]
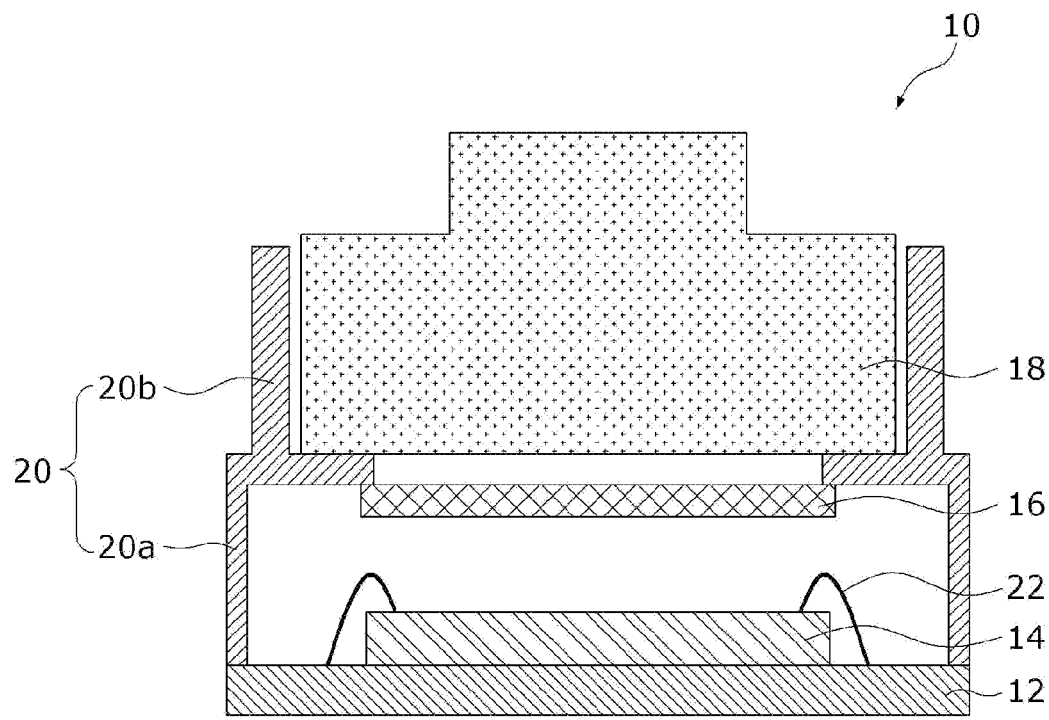
[FIG. 2]
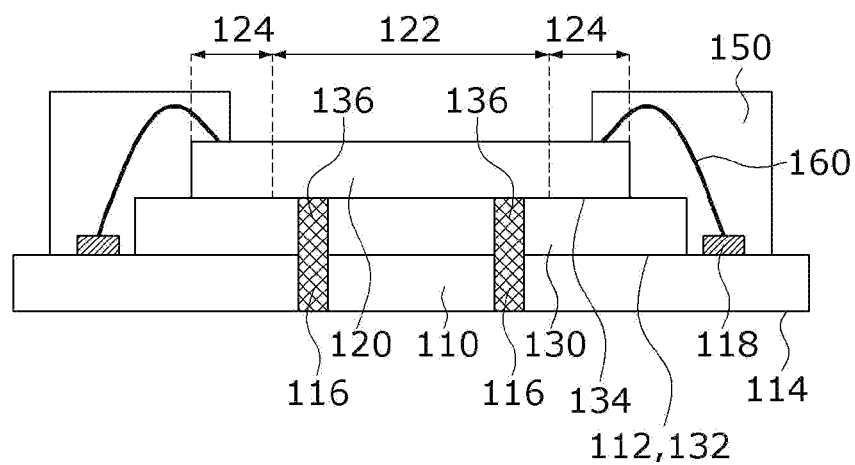

[FIG. 3]
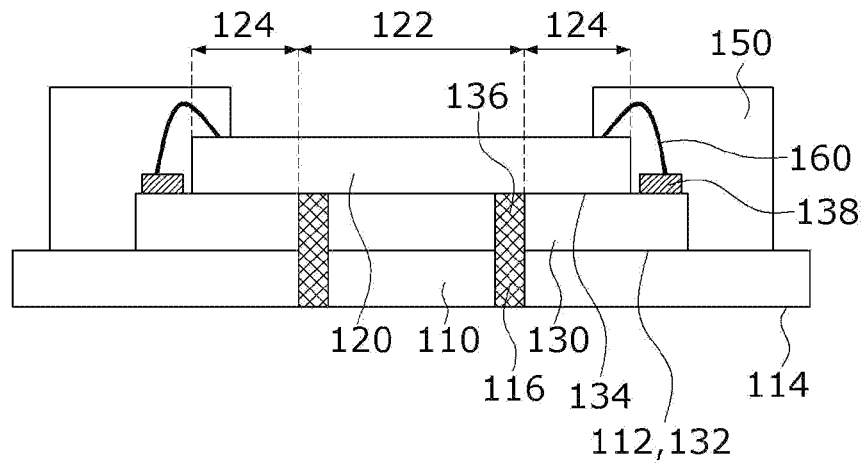
[FIG. 4A]
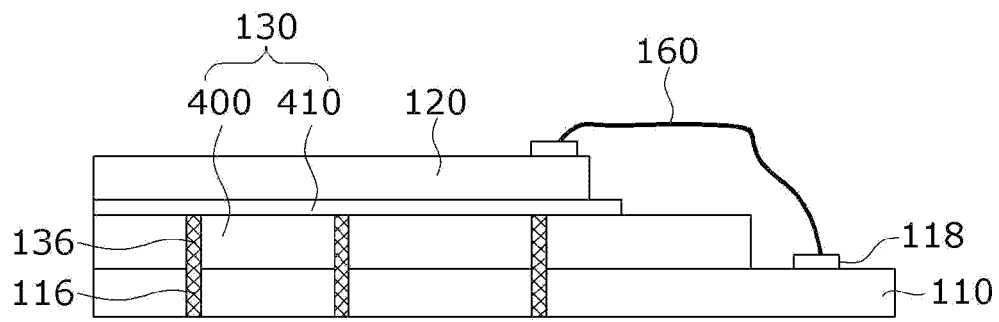
[FIG. 4B]
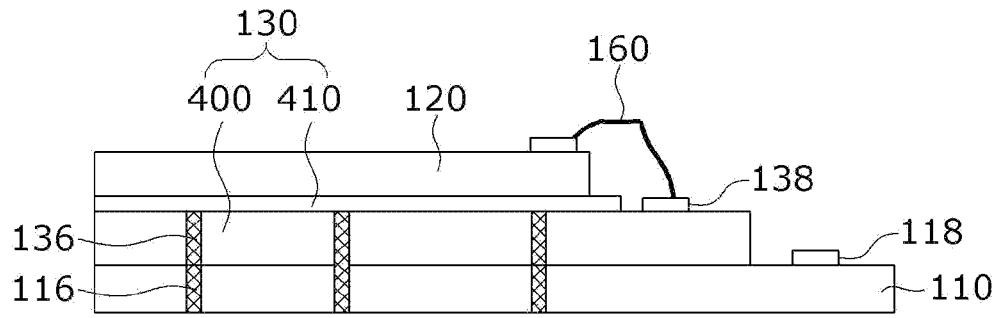

[FIG. 5]
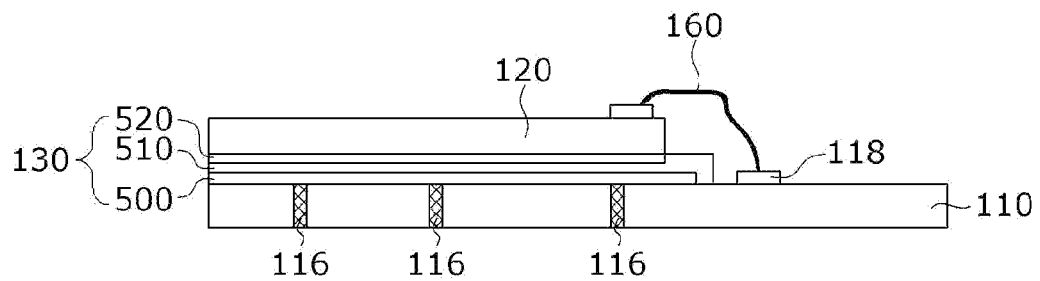
[FIG. 6]
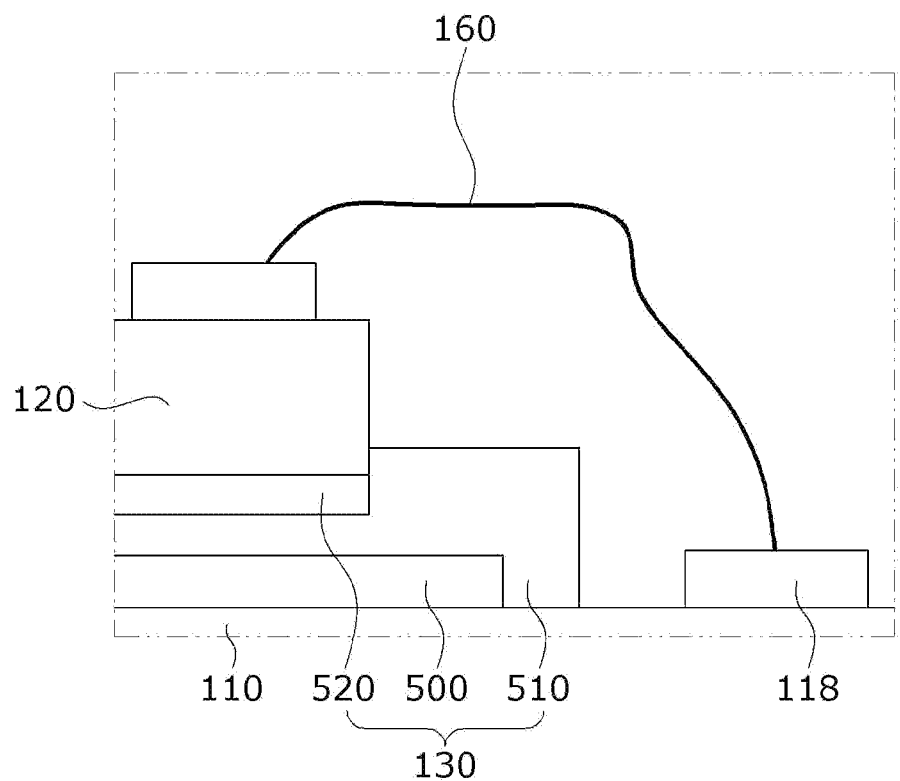

[FIG. 7]
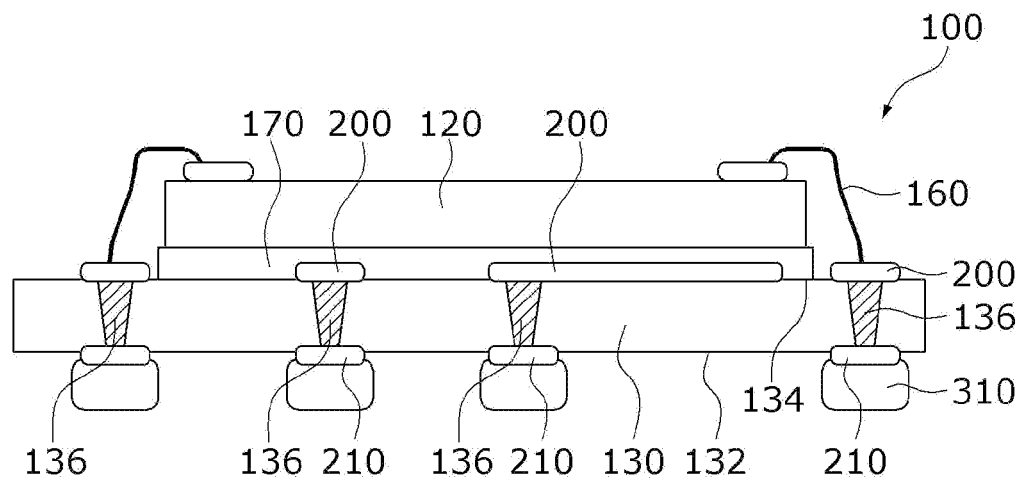
[FIG. 8]
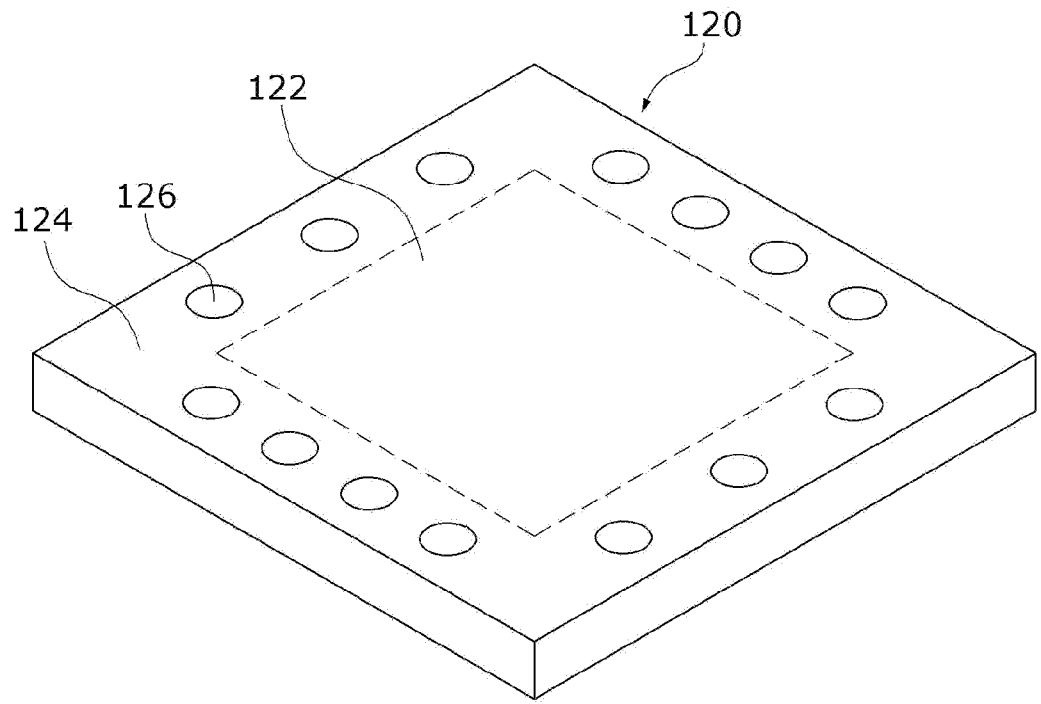

[FIG. 9]
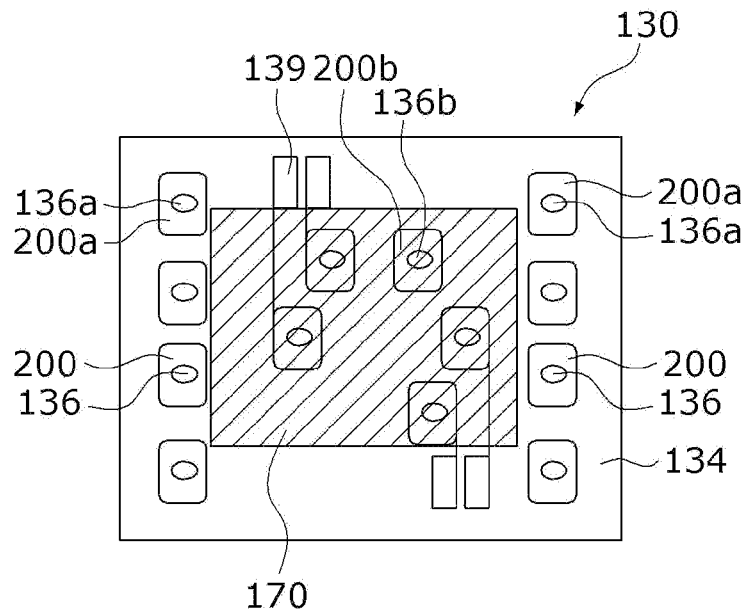
[FIG. 10]
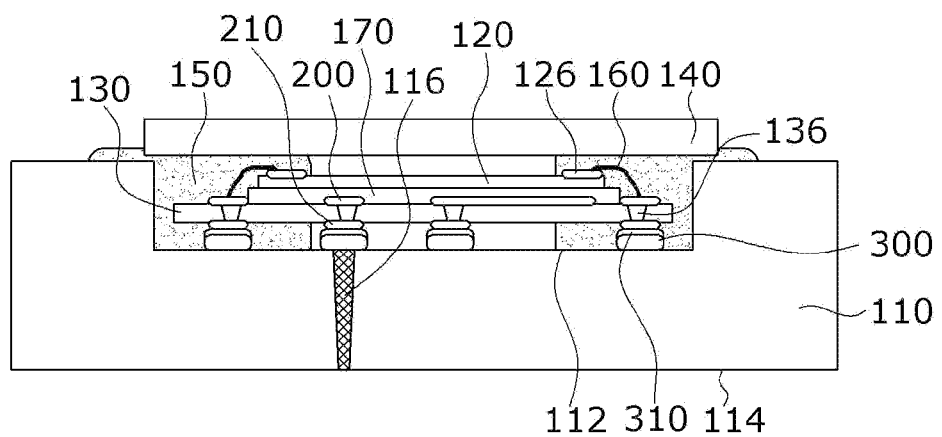

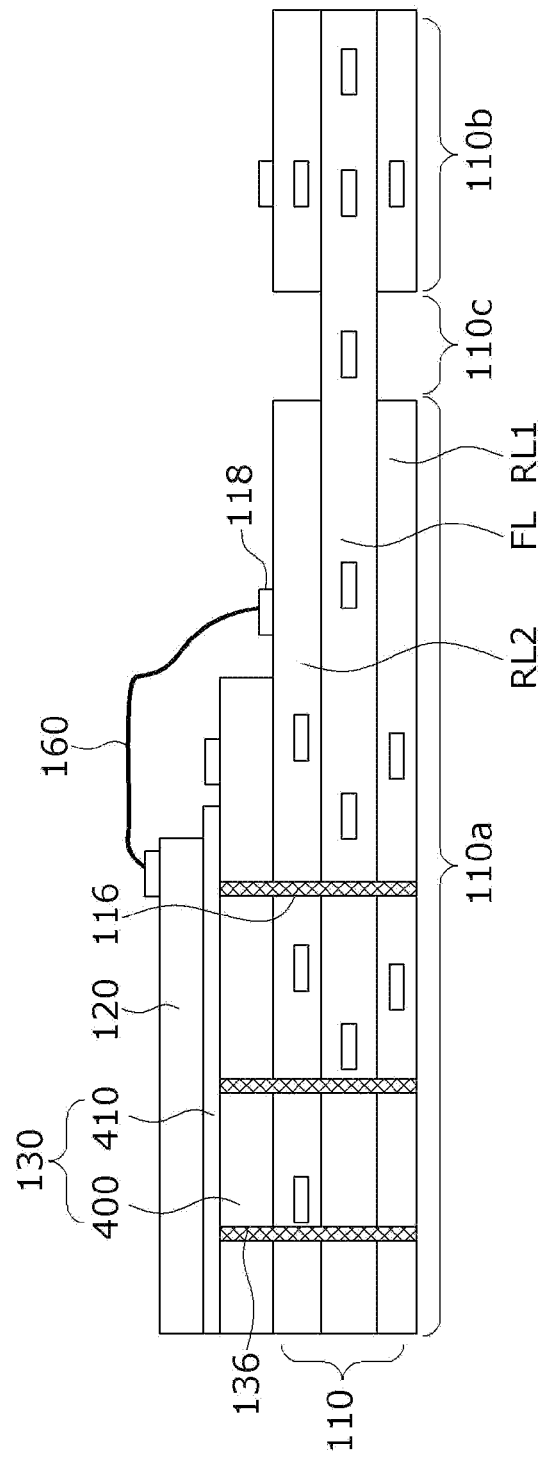

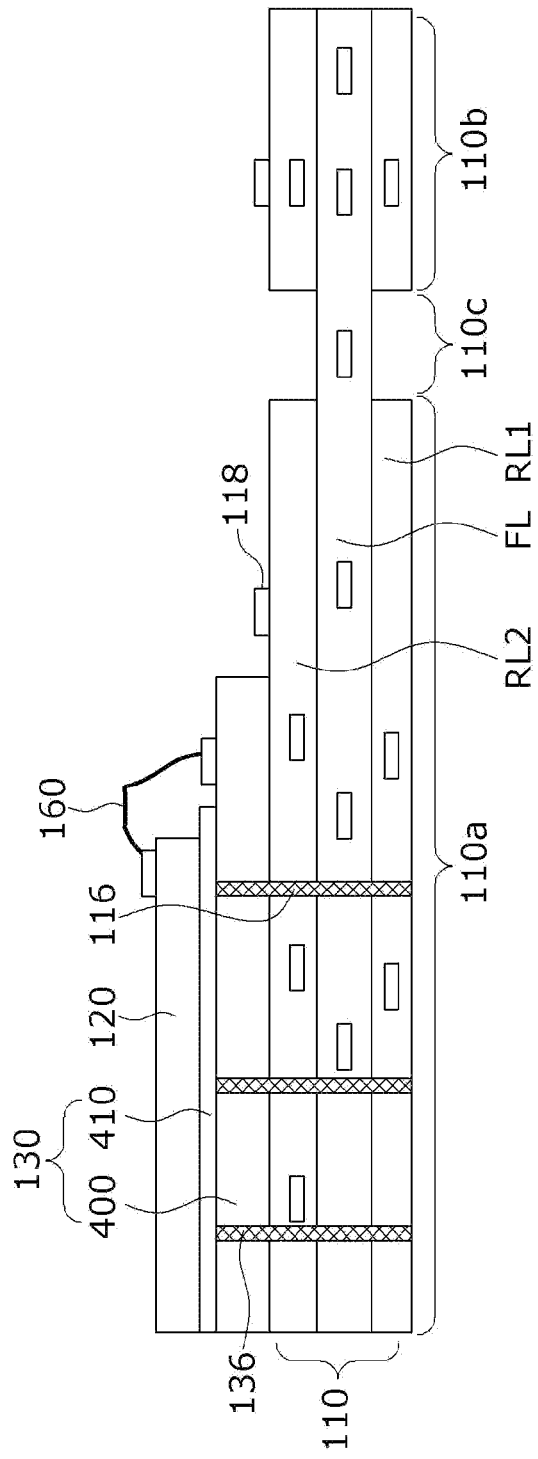
[FIG. 11B]

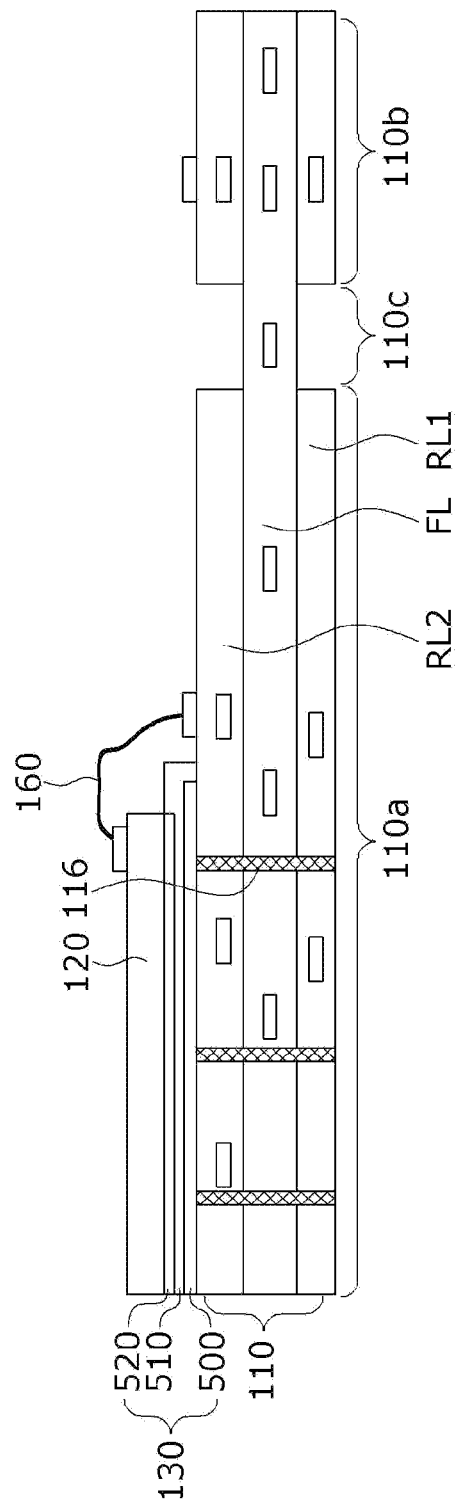
[FIG. 11C]

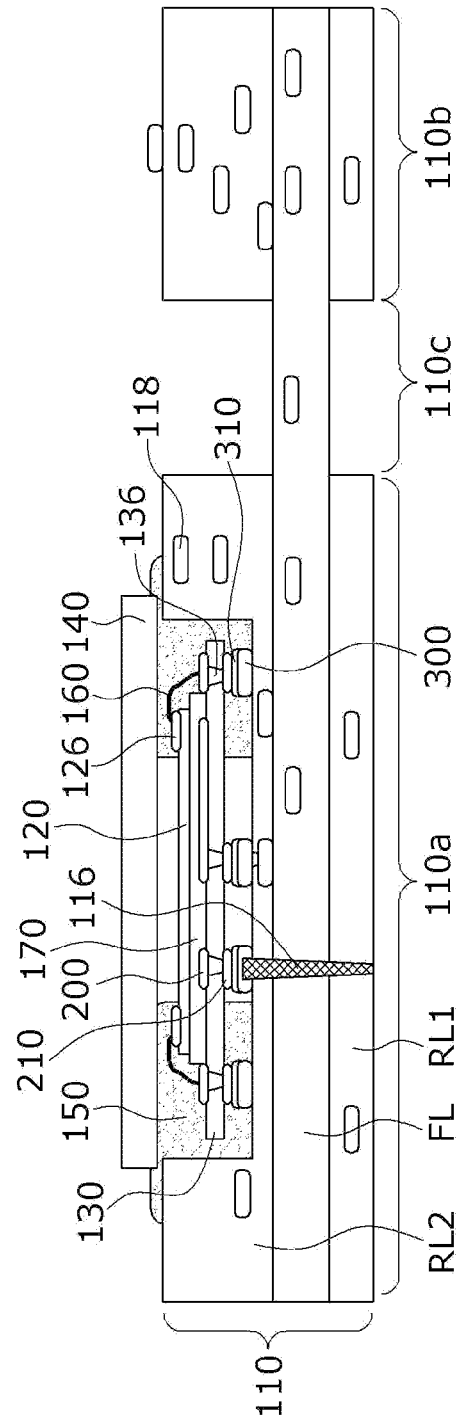
[FIG. 11D]

IMAGE SENSOR PACKAGE AND CAMERA DEVICE INCLUDING SAME

CROSS-REFERENCE TO RELATED PATENT APPLICATIONS

This application is a U.S. National Stage Application under 35 U.S.C. § 371 of PCT Application No. PCT/KR2021/005663, filed May 6, 2021, which claims priority to Korean Patent Application Nos. 10-2020-0060470 and 10-2020-0060471, both filed May 20, 2020, whose entire disclosures are hereby incorporated by reference.

TECHNICAL FIELD

The present invention relates to a camera device, and more specifically, to an image sensor package and a camera device including the same.

BACKGROUND ART

Cameras are apparatuses which capture images or moving images of subjects and are installed in portable devices, drones, vehicles, and the like. Due to trend toward a full screen and a narrow bezel of a portable device, an ultra-high resolution, a multi-camera, a zoom function, and a 5G module, miniaturization and high performance of the camera devices are further required.

Generally, in a camera device installed in a portable device or the like, an image sensor may be disposed on a printed circuit board, the image sensor and the printed circuit board may be wire-bonded, an infrared (IR) filter may be disposed above the image sensor to be spaced a predetermined distance from the image sensor, and a lens assembly may be disposed apart from the IR filter by a predetermined distance.

Accordingly, since a total thickness from the printed circuit board to the IR filter is 1000 μm or more, it may be a severe limitation on the miniaturization of the camera device.

Meanwhile, according to trend of a high resolution and a high speed of a video frame, an amount of power consumption and an amount of heat generation of an image sensor are increasing when compared to the conventional image sensor. Accordingly, a technology for efficiently radiating heat generated by an image sensor to the outside is required.

Technical Problem

The present invention is directed to providing an image sensor package of a camera device capable of being implemented with a small size and having superior heat radiation performance.

Technical Solution

One aspect of the present invention provides a camera device including an image sensor package and a lens assembly disposed on the image sensor package, wherein the image sensor package includes a printed circuit board, a heat radiation layer disposed on a first surface of the printed circuit board, and an image sensor disposed on the heat radiation layer, a plurality of through-holes passing through the printed circuit board from the first surface to a second surface which is a surface opposite to the first surface are formed in the printed circuit board, and the plurality of through-holes are in contact with the heat radiation layer.

The plurality of through-holes may be filled with a metal.

The plurality of through-holes may be formed to extend to the heat radiation layer.

The heat radiation layer may include an insulating substrate including a metal oxide.

The metal oxide may be included at 90 wt % or more in the insulating substrate based on a total weight.

The metal oxide may be an oxide of at least one of Al and Mg.

The heat radiation layer further may include a thermal interface material disposed between the insulating substrate and the image sensor.

The heat radiation layer may include a first metal layer disposed on the printed circuit board, a thermal interface material disposed on the first metal layer, and a second metal layer disposed on the thermal interface material, wherein the first metal layer may be in contact with the printed circuit board, the second metal layer may be in contact with the image sensor, and a thickness of the first metal layer may be greater than a thickness of the second metal layer.

The thermal interface material may be disposed on an upper surface of the first metal layer, a side surface of the first metal layer, and an upper surface of the printed circuit board.

The thermal interface material may be further disposed on a lower surface of the second metal layer and a side surface of the second metal layer.

The thermal interface material may be further disposed on a side surface of the image sensor.

A wire of the image sensor may be connected to a circuit pattern disposed on the heat radiation layer.

An area of the heat radiation layer may be greater than an area of the image sensor and smaller than an area of the printed circuit board.

The printed circuit board may include a rigid flexible (RF) printed circuit board including a rigid region and a flexible region and the image sensor is disposed in the rigid region of the printed circuit board.

Another aspect of the present invention provides an image sensor package including an insulating substrate including a metal oxide and an image sensor disposed on a first surface of the insulating substrate, wherein the insulating substrate includes a plurality of through-holes passing through the insulating substrate from the first surface to a second surface which is a surface opposite to the first surface, and at least some through-holes of the plurality of through-holes are electrical connection paths of the image sensor.

The image sensor package may include a plurality of first metal pads disposed on the first surface of the insulating substrate and a plurality of second metal pads disposed on the second surface of the insulating substrate, wherein the plurality of first metal pads and the plurality of second metal pads may be disposed to surround the plurality of through-holes of the insulating substrate.

Wires connected to the image sensor may be connected to some of the plurality of first metal pads, and the at least some of the through-holes may be filled with a conductive material.

The image sensor package may further include a solder resist layer disposed between the insulating substrate and the image sensor, wherein the solder resist layer may be disposed to cover some of the plurality of first metal pads.

Still another aspect of the present invention provides image sensor package including a printed circuit board, an insulating substrate which is disposed on the printed circuit board and includes a metal oxide, and an image sensor disposed on a first surface of the insulating substrate, wherein the insulating substrate includes a plurality of through-holes passing through the insulating substrate from the first surface to a second surface which is a surface opposite to the first surface, and at least some through-holes of the plurality of through-holes are electrical connection paths of the image sensor.

The image sensor package may include a plurality of first metal pads disposed on the first surface of the insulating substrate and a plurality of second metal pads disposed on a second surface of the insulating substrate, wherein the plurality of first metal pads and the plurality of second metal pads may be disposed to surround the plurality of through-holes of the insulating substrate.

A plurality of third metal pads may be disposed on the printed circuit board, and at least some of the plurality of second metal pads may be connected to at least some of the plurality of third metal pads.

The solder layer may be disposed between at least some of the plurality of second metal pads and at least some of the plurality of third metal pads.

A plurality of through-holes passing through the printed circuit board from a first surface, on which the plurality of third metal pads are formed, to a second surface which is a surface opposite to the first surface of the printed circuit board may be formed in the printed circuit board, and at least some of the plurality of through-holes may be connected to at least some of the plurality of third metal pads.

A cavity may be formed in the printed circuit board, and the insulating substrate and the image sensor may be accommodated in the cavity.

The image sensor package may further include a molding layer which fixes the printed circuit board, the insulating substrate, and the image sensor in the cavity.

The image sensor package may further include a filter layer disposed on the molding layer.

The printed circuit board may be a rigid flexible (RF) printed circuit board including a rigid region and a flexible region, and the image sensor may be disposed in the rigid region of the printed circuit board.

Yet another aspect of the present invention provides a camera device including an image sensor package and a lens assembly disposed on the image sensor package, wherein the image sensor package includes a printed circuit board, an insulating substrate which is disposed on the printed circuit board and includes a metal oxide, and an image sensor disposed on a first surface of the insulating substrate, the insulating substrate incudes a plurality of through-holes passing through the insulating substrate from the first surface to a second surface which is a surface opposite to the first surface, and at least some through-holes of the plurality of through-holes are electrical connection paths of the image sensor.

Advantageous Effects

According to embodiments of the present invention, a camera device, of which a structure is simple, a manufacturing process is simple, and a size is small, can be obtained. In addition, according to the embodiments of the present invention, an image sensor package, which not only supports high performance and but also has superior heat radiation performance, and the camera device including the same can be obtained.

DESCRIPTION OF DRAWINGS

FIG. 1 is a cross-sectional view illustrating an example of a camera device.

FIGS. 2 and 3 are cross-sectional views illustrating image sensor packages according to one embodiments of the present invention.

FIGS. 4A and 4B are cross-sectional views illustrating parts of image sensor packages according to embodiments of the present invention.

FIG. 5 is a cross-sectional view illustrating a part of an image sensor package according to another embodiment of the present invention.

FIG. 6 is an enlarged view illustrating a part of FIG. 5.

FIG. 7 is a cross-sectional view illustrating an image sensor package according to another embodiment of the present invention.

FIG. 8 is a perspective view illustrating an image sensor included in the image sensor package of FIG. 7.

FIG. 9 is a top view illustrating a heat radiation layer included in the image sensor package of FIG. 7.

FIG. 10 is a cross-sectional view illustrating an image sensor package according to another embodiment of the present invention.

FIGS. 11A, 11B, 11C, and 11D are cross-sectional views illustrating of parts of image sensor packages according to other embodiments of the present invention.

MODES OF THE INVENTION

Hereinafter, specific embodiments of the present invention will be described in detail with reference to the accompanying drawings.

However, the technical spirit of the present invention is not limited to some embodiments which will be described and may be embodied in a variety of different forms, and at least one or more components of the embodiments may be selectively combined, substituted, and used within the range of the technical spirit.

In addition, unless clearly and specifically defined otherwise by the context, all terms (including technical and scientific terms) used herein can be interpreted as having meanings customarily understood by those skilled in the art, and meanings of generally used terms, such as those defined in commonly used dictionaries, will be interpreted in consideration of contextual meanings of the related art.

In addition, the terms used in the embodiments of the present invention are considered in a descriptive sense only and not to limit the present invention.

In the present specification, unless clearly indicated otherwise by the context, singular forms include the plural forms, and in a case in which "at least one (or one or more) among A, B, and C" is described, this may include at least one combination among all possible combinations of A, B, and C.

In addition, in descriptions of components of the present invention, terms such as "first," "second," "A," "B," "(a)," and "(b)" can be used.

The terms are only to distinguish one element from another element, and the essence, order, and the like of the elements are not limited by the terms.

In addition, it should be understood that, when an element is referred to as being "connected" or "coupled" to another element, such a description may include both a case in which the element is directly connected or coupled to another element, and a case in which the element is connected or coupled to another element with still another element disposed therebetween.

In addition, when any one element is described as being formed or disposed "on" or "under" another element, such a description includes both a case in which the two elements are formed or disposed in direct contact with each other and a case in which one or more other elements are interposed between the two elements. In addition, when one element is described as being formed "on or under" another element, such a description may include a case in which the one element is formed at an upper side or a lower side with respect to another element.

FIG. 1 is a cross-sectional view illustrating an example of a camera device.

Referring to FIG. 1, a camera device 10 may include a printed circuit board 12, an image sensor 14 disposed on the printed circuit board 12, a filter layer 16 disposed above the image sensor 14, and a lens assembly 18 disposed above the filter layer 16. The printed circuit board 12, the image sensor 14, the filter layer 16, and the lens assembly 18 may be accommodated in a housing 20.

The printed circuit board 12 may include a flexible printed circuit board (FPCB), a rigid flexible printed circuit board (RFPCB), or a ceramic printed circuit board.

The image sensor 14 may be disposed on the printed circuit board 12 and bonded thereto using wires 22. The image sensor 14 is a sensor which collects incident light to generate an image signal, and a semiconductor element used in the image sensor 14 may be formed as a charged coupled device (CCD) sensor or a complementary metal-oxide semiconductor (CMOS) sensor and may be a semiconductor element which captures an image of a person or object and outputs an electrical signal.

The image sensor 14 may include a plurality of pixels arrayed in a matrix form. Each of the pixels may include a photoelectric conversion element and at least one transistor for sequentially outputting voltage levels of the photoelectric conversion element. A region in which the plurality of pixels are disposed may be an active area of the image sensor 14. The active area of the image sensor 14 may be interchangeably used with a light receiving part.

The filter layer 16 may be formed of a glass substrate, and the glass substrate may be a transparent or translucent substrate formed of a glass material. The filter layer 16 may block or transmit light with a predetermined wavelength. As an example, the filter layer 16 may be an IR blocking layer which blocks infrared light.

Generally, the filter layer 16 may be disposed apart from the image sensor 14. As illustrated in the drawing, the filter layer 16 may be bonded to the housing 20.

Alternatively, although not illustrated in the drawing, the image sensor 14 and the filter layer 16 may be bonded by an adhesive member.

The lens assembly 18 may include at least one lens, have a predetermined field of view and a focal distance, refract incident light, and transmit the refracted light to the image sensor 14. The lens assembly 18 may be moved by an actuator (not shown). When the lens assembly 18 includes a plurality of lenses, an optical system may be formed by arranging the lenses based on a central axis. In this case, the central axis may be the same as an optical axis of the optical system. The lens assembly 18 may be a lens with a fixed focal distance or variable lens of which a focus is adjusted.

The housing 20 may be disposed at an upper edge of the printed circuit board 12. The housing 20 may include a first housing 20a and a second housing 20b. The first housing 20a may accommodate an image sensor package including the image sensor 14 and the filter layer 16, and the second housing 20b may include the lens assembly 18. A lower end portion of the first housing 20a may be bonded to and coupled to the printed circuit board 12 by an adhesive member. In this case, although not illustrated in the housing 20, a lens holder which supports the lens may be integrally formed with the housing 20.

FIG. 1 and the explanation with reference to FIG. 1 have been described in order to described a general example of a structure and an operation principle of the camera device according to the embodiment of the present invention. Parts of FIG. 1 and the description with reference to FIG. 1 may be applied to the camera device according to the embodiment of the present invention, but the embodiment of the present invention is not limited to a detail structure illustrated in FIG. 1.

According to one embodiment of the present invention, a heat radiation layer is disposed between a printed circuit board and an image sensor, and heat generated by the image sensor is radiated through the heat radiation layer and the printed circuit board.

FIGS. 2 and 3 are cross-sectional views illustrating image sensor packages according to one embodiments of the present invention.

Referring to FIGS. 2 and 3, an image sensor package 100 according to one embodiment of the present invention includes a printed circuit board 110, an image sensor 120 disposed above the printed circuit board 110, and a heat radiation layer 130 disposed between the printed circuit board 110 and the image sensor 120.

In this case, the image sensor 120 may be disposed above the printed circuit board 110 and bonded thereto using wires 160. The same description as that of the image sensor 14 of FIG. 1 may be applied to the image sensor 120.

Although not illustrated in the drawings, the image sensor package 100 may further include a filter layer disposed above the image sensor 120. As illustrated in FIG. 1, the filter layer may be disposed apart from the image sensor 120 using a support member (for example, a housing) which supports the filter layer, disposed in direct contact with the image sensor 120, or disposed in contact with the image sensor 120 through a bonding layer.

The image sensor package 100 according to the embodiment of the present invention may further include a molding layer 150 which molds the image sensor 120 and the wires bonded to the image sensor 120. In this case, the molding layer 150 may be disposed to extend from a non-active area of the image sensor 120 to the printed circuit board 110 through the heat radiation layer 130. Accordingly, a thickness of the image sensor package 100 can be decreased compared to a structure of a chip on board (COB), the wires 160 bonded to the image sensor 120 can be stably fixed, and an assembly process and a structure of the image sensor package 100 can be simplified. In addition, since the molding layer 150 molds the wires 160 bonded to the image sensor 120, wire bonding failures can be minimized, and heat generated by the image sensor 120 can also be radiated to the outside through the molding layer 150.

According to the embodiment of the present invention, a first surface 132 of the heat radiation layer 130 is in contact with a first surface 112 of the printed circuit board 110 on the first surface 112 of the printed circuit board 110, and a second surface 134 of the image sensor 120 is disposed in contact with the heat radiation layer 130. In this case, a thermal conductivity of the heat radiation layer 130 may be higher than a thermal conductivity of the printed circuit board 110.

In addition, according to the embodiment of the present invention, a plurality of through-holes 116 passing through the printed circuit board 110 from the first surface 112 to a second surface 114 which is a surface opposite to the first surface 112 may be formed in the printed circuit board 110, and the plurality of through-holes 116 may be in contact with the heat radiation layer 130. Accordingly, the heat generated by the image sensor 120 may be transferred to the heat radiation layer 130, and the heat transferred to the heat radiation layer 130 can be radiated to the outside through the plurality of through-holes 116 formed in the printed circuit board 110.

In this case, the plurality of through-holes 116 may be filled with a thermally conductive material. As an example, the thermally conductive material may be a thermally conductive metal including at least one among gold (Au), silver (Ag), copper (Cu), and aluminum (Al). Since a thermal conductivity of the plurality of through-holes 116 formed in the printed circuit board 110 is higher than the thermal conductivity of the printed circuit board 110, the heat generated by the image sensor 120 and transferred to the heat radiation layer 130 can be efficiently radiated to the outside through the plurality of through-holes 116 formed in the printed circuit board 110.

According to the embodiment of the present invention, the plurality of through-holes 116 may also be formed to extend to the heat radiation layer 130. That is, a plurality of through-holes 136 may also be formed in the heat radiation layer 130, and the plurality of through-holes 136 may also be filled with a thermally conductive material having a thermal conductivity higher than the thermal conductivity of the of the heat radiation layer 130. Accordingly, the heat generated by the image sensor 120 can be more efficiently radiated to the outside through the plurality of through-holes 136 formed in the heat radiation layer 130 and the plurality of through-holes 116 formed in the printed circuit board 110.

According to the embodiment of the present invention, an area of the heat radiation layer 130 may be greater than an area of the image sensor 120. Accordingly, the heat generated by the image sensor 120 can be efficiently radiated through the heat radiation layer 130, and the image sensor 120 may be easily mounted on the heat radiation layer 130.

Meanwhile, as illustrated in FIG. 2, the wires 160 connected to the image sensor 120 may be directly connected to the printed circuit board 110. To this end, the area of the heat radiation layer 130 may be smaller than an area of the printed circuit board 110, and the wires 160 connected to the image sensor 120 may be connected to a circuit pattern 118 formed in a region in which the heat radiation layer 130 is not disposed in the first surface 112 of the printed circuit board 110.

Alternatively, as illustrated in FIG. 3, the wires 160 connected to the image sensor 120 may also be connected to the printed circuit board 110 through the heat radiation layer 130. To this end, the wires 160 connected to the image sensor 120 may be connected to a circuit pattern 138 formed in a region in which the image sensor 120 is not disposed in the second surface 134 of the heat radiation layer 130, and the circuit pattern 138 may be electrically connected to the printed circuit board 110 through via holes (not shown) formed in the heat radiation layer 130.

Hereinafter, the heat radiation layer included in the image sensor package according to the embodiment of the present invention will be described in more detail.

FIGS. 4A and 4B are cross-sectional views illustrating parts of image sensor packages according to embodiments of the present invention.

Referring to FIGS. 4A and 4B, a heat radiation layer 130 is disposed on a printed circuit board 110, and an image sensor 120 is disposed on the heat radiation layer 130. As described with reference to FIGS. 2 and 3, a plurality of through-holes 116 may be formed in the printed circuit board 110, and the plurality of through-holes 116 may be formed to extend to the heat radiation layer 130. That is, a plurality of through-holes 136 connected to the plurality of through-holes 116 may be formed in the heat radiation layer 130, and the plurality of through-holes 116 and 136 may be filled with a thermally conductive material.

In addition, as illustrated in FIG. 4A, the wire 160 connected to the image sensor 120 may be directly connected to a circuit pattern 118 of the printed circuit board 110, or as illustrated in FIG. 4B, the wire 160 connected to the image sensor 120 may be connected to the printed circuit board 110 through a circuit pattern 138 of the heat radiation layer 130.

Meanwhile, according to the embodiment of the present invention, the heat radiation layer 130 may include an insulating substrate 400 including a metal oxide. Since a thermal conductivity of the insulating substrate 400 including the metal oxide is higher than a thermal conductivity of the printed circuit board 110, heat generated by the image sensor 120 can be efficiently transferred to the printed circuit board 110 through the heat radiation layer 130. In this case, the insulating substrate 400 including the metal oxide may be formed on the printed circuit board 110 through a high temperature co-fired ceramic (HTCC) process or low temperature co-fired ceramic (LTCC) process. The HTCC process is a process of sintering at a temperature of 1300° C. or higher, and the LTCC process is a process of sintering at a temperature of 800 to 1000° C. Accordingly, the printed circuit board 110 and the insulating substrate 400 including the metal oxide can be bonded with a high bonding strength, and a heat transfer efficiency of an interface between the insulating substrate 400 and the printed circuit board 110 can be high.

In this case, the metal oxide may be included at 90 wt % or more in the insulating substrate based on a total weight, and the metal oxide may be an oxide of at least one of Al and Mg. As an example, the metal oxide may include at least one of $Al_2O_3$ and MgO. Accordingly, since the thermal conductivity of the insulating substrate 400 is high, the heat generated by the image sensor 120 can be efficiently radiated to the outside through the insulating substrate 400.

In this case, according to the embodiment of the present invention, the heat radiation layer 130 may further include a thermal interface material 410 disposed between the insulating substrate 400 including the metal oxide and the image sensor 120. Two surfaces of the thermal interface material 410 may be in direct contact with the insulating substrate 400 and the image sensor 120 and transfer the heat generated by the image sensor 120 to the insulating substrate 400. In this case, the thermal interface material 410 may be a resin composite having heat transfer and bonding properties and includes a silicon-based resin or an epoxy-based resin and an inorganic filler. As described above, when the thermal interface material 410 is further disposed between the insulating substrate 400 and the image sensor 120, the insulating substrate 400 and the image sensor 120 may be bonded with a high bonding strength, and the heat generated by the image sensor 120 can be efficiently transferred to the insulating substrate 400.

FIG. 5 is a cross-sectional view illustrating a part of an image sensor package according to another embodiment of the present invention, and FIG. 6 is an enlarged view illustrating a part of FIG. 5. Repeated description of content that is the same as that described with reference to FIGS. 1 to 4 will be omitted.

Referring to FIGS. 5 and 6, a heat radiation layer 130 may include a first metal layer 500 disposed on a printed circuit board 110.

In this case, the first metal layer 500 may be printed with a circuit pattern 118 of the printed circuit board 110 and may be a dummy metal pattern which is not connected to the circuit pattern 118. As described above, a plurality of through-holes 116 filled with a thermally conductive material may be formed in the printed circuit board 110, and the plurality of through-holes 116 may be in contact with the first metal layer 500. Accordingly, heat of the first metal layer 500 can be radiated to the outside through the plurality of through-holes 116, and the first metal layer 500 may also be referred to as a heat radiation pad or heat radiation pattern.

In this case, a material and a thickness of the first metal layer 500 may be the same as a material and a thickness of the circuit pattern 118 on the printed circuit board 110. Accordingly, since the first metal layer 500 may be printed with the circuit pattern 118 when the circuit pattern 118 is printed on the printed circuit board 110, an additional process for forming the heat radiation pad may not be required.

Meanwhile, the heat radiation layer 130 may further include a thermal interface material 510 disposed on the first metal layer 500. In this case, the thermal interface material 510 may be a resin composite having heat transfer and bonding properties and include a silicon-based resin or epoxy-base resin and an inorganic filler. As described above, when the thermal interface material 510 is further disposed between the first metal layer 500 and an image sensor 120, the first metal layer 500 and the image sensor 120 may be bonded with a high bonding strength, and heat generated by the image sensor 120 can be efficiently transferred to the first metal layer 500.

In addition, the heat radiation layer 130 may further include a second metal layer 520 disposed on the thermal interface material 510. In this case, two surfaces of the thermal interface material 510 may be in direct contact with the first metal layer 500 and the second metal layer 520, and two surfaces of the second metal layer 520 may be in direct contact with the thermal interface material 510 and the image sensor 120. To this end, one surface of the image sensor 120 may be coated with the second metal layer 520, and the thickness of the first metal layer 500 may be greater than a thickness of the second metal layer 520. As an example, the thickness of the first metal layer 500 may be in the range of 10 to 20 μm, and the thickness of the second metal layer 520 may be in the range of 0.1 to 2 μm and preferably 0.1 to 0.5 μm. As described above, when the heat radiation layer 130 further includes the second metal layer 520 with which the image sensor 120 is coated, heat of the image sensor 120 can be more efficiently transferred to the thermal interface material 510 and the first metal layer 500.

In this case, the thermal interface material 510 may be disposed to cover an upper surface of the first metal layer 500 and a side surface of the first metal layer 500, and thus, the thermal interface material 510 may also be disposed on an upper surface of the printed circuit board 110. Accordingly, since heat is transferred to the printed circuit board 110 through not only the first metal layer 500 but also the thermal interface material 510, the heat radiation performance of an image sensor package 100 can be improved. In addition, an interface between the first metal layer 500 and the printed circuit board 110 may be bonded by the thermal interface material 510, a bonding strength between the first metal layer 500 and the printed circuit board 110 can further increase.

In addition, the thermal interface material 510 may be disposed to cover a lower surface of the second metal layer 520 and a side surface of the second metal layer 520 and further disposed on a side surface of the image sensor 120. Accordingly, since the heat of the image sensor 120 may be directly transferred to not only the second metal layer 520 but also the thermal interface material 510, the heat radiation performance of the image sensor package 100 can be further improved.

Meanwhile, according to another embodiment of the present invention, a plurality of through-holes may be formed in a heat radiation layer on which an image sensor is disposed, and some of the plurality of through-holes may be electrical connection paths of the image sensor.

FIG. 7 is a cross-sectional view illustrating an image sensor package according to another embodiment of the present invention, FIG. 8 is a perspective view illustrating an image sensor included in the image sensor package of FIG. 7, FIG. 9 is a top view illustrating a heat radiation layer included in the image sensor package of FIG. 7, and FIG. 10 is a cross-sectional view illustrating an image sensor package according to another embodiment of the present invention.

Referring to FIGS. 7 to 10, an image sensor package 100 according to another embodiment of the present invention includes a printed circuit board 110, an image sensor 120 disposed above the printed circuit board 110, a heat radiation layer 130 disposed between the printed circuit board 110 and the image sensor 120, and a filter layer 140 disposed above the image sensor 120. The heat radiation layer 130 is an insulating substrate including a metal oxide. Accordingly, the heat radiation layer 130 may be referred to as an insulating substrate. In relation to the heat radiation layer 130, the content described with reference to FIGS. 2 to 6 excluding content which will be described below may be applied to the heat radiation layer 130. Accordingly, in relation to the heat radiation layer 130, repeated description of the content that is the same as that described with reference to FIGS. 2 to 6 will be omitted.

In this case, the descriptions about the image sensor 14 and the filter layers 16 of FIG. 1 may be applied to the image sensor 120 and the filter layer 140.

As illustrated in FIG. 8, the image sensor 120 includes an active area 122 and a non-active area 124 surrounding the active area 122. As described above, the active area 122 of the image sensor 120 may be a light receiving part on which a plurality of pixels are disposed, and pads 126 for bonding may be formed in the non-active area 122.

The image sensor package 100 according to the embodiment of the present invention may further include wires connected to the printed circuit board 110, the image sensor 120, and the image sensor 120 and a molding layer 150 fixing the filter layer 140. Accordingly, a thickness of the image sensor package 100 can be decreased compared to a chip on board (COB) structure, the wires bonded to the image sensor 120 can be stably fixed, and an assembly process and a structure of the image sensor package 100 can be simplified. In addition, since the molding layer 150 molds the wires bonded to the image sensor 120, wire bonding failures can be minimized, and heat generated by the image sensor 120 can also be radiated to the outside through the molding layer 150.

According to the embodiment of the present invention, the heat radiation layer 130 includes a plurality of through-holes 136 passing through the heat radiation layer 130 from a first surface 132 to a second surface 134 which is a surface opposite to the first surface 132. In addition, at least some through-holes of the plurality of through-holes 136 may be electrical connection paths of the image sensor 120. Accordingly, even when wires 160 connected to the image sensor 120 are not directly connected to the printed circuit board 110, the wires 160 may be connected to the printed circuit board 110 through the heat radiation layer 130. Particularly, when the plurality of through-holes 136 which are the electrical connection paths between the image sensor 120 and the printed circuit board 110 are formed in a direction in which the plurality of through-holes 136 pass through the two surfaces 132 and 134 of the heat radiation layer 130, the heat radiation layer 130 and the image sensor 120 are manufactured as a module, and the module is easily bonded to the printed circuit board 110.

More specifically, referring to FIGS. 7 to 9, a plurality of first metal pads 200 may be disposed on the second surface 134 of the heat radiation layer 130, and a plurality of second metal pads 210 may be disposed on the first surface 132. In this case, the plurality of first metal pads 200 and the plurality of second metal pads 210 may be disposed to surround the plurality of through-holes 136. That is, a pair of the first metal pad 200 and the second metal pad 210 may be disposed to correspond to one through-hole 136. Hereinafter, one through-hole 136 and the pair of the first metal pad 200 and the second metal pad 210 are referred to as one through-hole set. According to the embodiment of the present invention, a plurality of through-hole sets may be formed in the heat radiation layer 130. As described above, at least some through-hole sets 136a and 200a of the plurality of through-hole sets may be the electrical connection paths between the image sensor 120 and the printed circuit board 110. At least some of the plurality of through-hole sets 136a and 200a which are the electrical connection paths between the image sensor 120 and the printed circuit board 110 may be disposed to correspond to the pads 126 that will be wire-bonded to the image sensor 120. That is, the at least some of the plurality of through-hole sets 136a and 200a which are the electrical connection paths between the image sensor 120 and the printed circuit board 110 may be disposed along an edge of the heat radiation layer 130 to correspond to the number and intervals of the pads 126 of the image sensor 120. Alternatively, at least some of the plurality of through-hole sets which becomes the electrical connection paths between the image sensor 120 and the printed circuit board 110 may be connected to the wires 160 connected to the image sensor 120 through conductive paths. In this case, the case of the connection through the conductive path may include both cases of a direct connection with the wires 160 connected to the image sensor 120 and an indirect connection through a metal pattern formed on the second surface 134 of the heat radiation layer 130. As an example, as illustrated in FIG. 9, metal pads 139 to be connected to the wires 160 may be disposed on the second surface 134 of the heat radiation layer 130, and the metal pads 139 may be connected to the through-hole sets along a circuit pattern. In this case, at least some through-holes of the plurality of through-holes 136 may be filled with a conductive material. As an example, the conductive material may be at least one among Au, Ag, Cu, an alloy thereof, and a conductive resin including the same.

According to the embodiment of the present invention, the remaining through-hole sets 136b and 200b of the plurality of through-hole sets may also be heat radiation paths. The remaining through-hole sets, which are the heat radiation paths, of the plurality of through-hole sets may not be electrically connected, and the through-hole 136 may be filled with a thermally conductive material. As an example, the thermally conductive material may be a thermally conductive material including at least one among Au, Ag, Cu, and Al. Accordingly, the heat generated by the image sensor 120 can be transferred to the printed circuit board 110 through some of the plurality of through-holes 136 of the heat radiation layer 130, and the heat transferred to the printed circuit board 110 can be radiated to the outside of the image sensor package 100.

Meanwhile, according to the embodiment of the present invention, a solder resist layer 170 may be further disposed between the heat radiation layer 130 and the image sensor 120. In this case, the solder resist layer 170 may be disposed to cover some of the plurality of first metal pads 200. Accordingly, the solder resist layer 170 may insulate the plurality of first metal pads 200 of the heat radiation layer 130 from the image sensor 120. However, the first metal pads 200 directly connected to the wires of the image sensor 120 may not be covered by the solder resist layer 170. To this end, an area of the solder resist layer 170 may be smaller than an area of the heat radiation layer 130.

According to the embodiment of the present invention, the heat radiation layer 130 on which the image sensor 120 is mounted may be manufactured as the module, the module including the image sensor 120 and the heat radiation layer 130 may be bonded to the printed circuit board 110.

Referring to FIG. 10, the plurality of second metal pads 210 disposed on the first surface 132 of the heat radiation layer 130 may be disposed on the printed circuit board 110. In this case, a plurality of second metal pads 300 may be disposed on the printed circuit board 110, and at least some of the plurality of second metal pads 210 may be electrically connected to at least some of the plurality of third metal pads 300. Accordingly, the wires connected to the image sensor 120 may be connected to the printed circuit board 110 through the heat radiation layer 130.

In this case, a solder layer 310 may be disposed between at least some of the plurality of second metal pads 210 and at least some of the plurality of third metal pads 300.

Accordingly, the heat radiation layer 130 and the printed circuit board 110 can be bonded with a high strength, and the wires connected to the image sensor 120 may be electrically connected to the printed circuit board 110 through the heat radiation layer 130.

In this case, a cavity may be formed in the printed circuit board 110, and the heat radiation layer 130 and the image sensor 120 provided as the module may be accommodated in the cavity. Accordingly, a separate structure for supporting side surfaces of the heat radiation layer 130 and the image sensor 120 which are modulized is not required, and a total size of the image sensor package 100 can be reduced.

According to the embodiment of the present invention, the molding layer 150 fixes the printed circuit board 110, the heat radiation layer 130, and the image sensor 120 in the cavity, and the filter layer 140 may be disposed on the molding layer 150. Accordingly, a separate structure for supporting the filter layer 140 is not required, and the total size of the image sensor package 100 can be reduced.

Meanwhile, according to the embodiment of the present invention, one or more through-holes 116 passing through the printed circuit board 110 from a first surface 112 to a second surface 114 which is a surface opposite to the first surface 112 may be formed in the printed circuit board 110, and at least some of the plurality of through-holes 116 may be connected to at least some of the plurality of third metal pads 300. Accordingly, the heat generated by the image sensor 120 can be transferred to the heat radiation layer 130, and the heat transferred to the heat radiation layer 130 can be radiated to the outside through the plurality of through-holes 116 formed in the printed circuit board 110.

Meanwhile, in the above-described embodiments, an example of the printed circuit board 110 which is a single-layered rigid substrate has been described, but the present invention is not limited thereto, the printed circuit board 110 of the image sensor package 100 according to the embodiment of the present invention may also be an RFPCB.

FIGS. 11A, 11B, 11C, and 11D are cross-sectional views illustrating of parts of image sensor packages according to other embodiments of the present invention. Repeated description of content that is the same as that described with reference to FIGS. 1 to 10 will be omitted.

Referring to FIGS. 11A to 11D, a printed circuit board 110 may be an RFPCB including rigid regions 110a and 110b and a flexible region 110c. In this case, an image sensor 120, a heat radiation layer 130, a filter layer (not shown), and a lens assembly (not shown) may be disposed in the rigid region 110a, other components, for example, terminals, may be disposed in the rigid region 110b, and the flexible region 110c may be dispose between one rigid region 110a and another rigid region 110b.

In this case, each of the rigid regions 110a and 110b may include a rigid layer 1 RL1, a flexible layer FL disposed on the rigid layer 1 RL1 and a rigid layer 2 RL2 disposed on the flexible layer FL, and the flexible region 110c may be connected to the flexible layer FL of each of the rigid regions 110a and 110b.

In this case, a plurality of through-holes 116 formed in the printed circuit board 110 may be formed to pass through the rigid layer 1 RL1, the flexible layer FL, and the rigid layer 2 RL2.

Accordingly, the printed circuit board 110 may be folded due to the flexible region 110c between the rigid regions 110a and 110b, and a camera device 10 may be accommodated in a small area in the folded state.

While the present invention has been described above with reference to exemplary embodiments, it may be understood by those skilled in the art that various modifications and changes of the present invention may be made within a range not departing from the spirit and scope of the present invention defined by the appended claims.

The invention claimed is:

1. A camera device comprising: an image sensor package; and a lens assembly disposed on the image sensor package, wherein the image sensor package includes a printed circuit board, a heat radiation layer disposed on a first surface of the printed circuit board, and an image sensor disposed on the heat radiation layer, a plurality of through-holes passing through the printed circuit board from the first surface to a second surface which is a surface opposite to the first surface are formed in the printed circuit board, and at least some of the plurality of through-holes pass through the heat radiation layer, wherein the heat radiation layer includes an insulating substrate including a metal oxide, and wherein the heat radiation layer further includes a thermal interface material disposed between the insulating substrate and the image sensor.

2. The camera device of claim 1, wherein the plurality of through-holes are filled with a metal.

3. The camera device of claim 2, wherein the at least some of the plurality of through-holes is electrically connected to the image sensor.

4. The camera device of claim 1, wherein the metal oxide is included at 90 wt % or more in the insulating substrate based on a total weight.

5. The camera device of claim 1, wherein the metal oxide is an oxide of at least one of Al and Mg.

6. The camera device of claim 1, wherein the heat radiation layer includes: a first metal layer disposed on the printed circuit board; a thermal interface material disposed on the first metal layer; and a second metal layer disposed on the thermal interface material, wherein the first metal layer is in contact with the printed circuit board, the second metal layer is in contact with the image sensor, and a thickness of the first metal layer is greater than a thickness of the second metal layer.

7. The camera device of claim 6, wherein the thermal interface material is disposed on: an upper surface of the first metal layer; a side surface of the first metal layer; a part of an upper surface of the printed circuit board; a lower surface of the second metal layer; a side surface of the second metal layer; and a part of a side surface of the image sensor.

8. The camera device of claim 1, wherein a wire of the image sensor is connected to a circuit pattern disposed on the heat radiation layer.

9. The camera device of claim 1, wherein an area of the heat radiation layer is greater than an area of the image sensor and smaller than an area of the printed circuit board.

10. The camera device of claim 1, wherein: the printed circuit board includes a rigid flexible (RF) printed circuit board including a rigid region and a flexible region; and the image sensor is disposed in the rigid region of the printed circuit board.

11. The camera device of claim 1, wherein: the heat radiation layer is an insulating substrate including a metal oxide; a plurality of through-holes are formed in the insulating substrate; at least some of the plurality of through-holes of the insulating substrate are electrical connection paths of the image sensor.

12. The camera device of claim 11, comprising: a plurality of first metal pads disposed on a first surface of the insulating substrate; and a plurality of second metal pads disposed on a second surface of the insulating substrate, wherein the plurality of first metal pads and the plurality of second metal pads are disposed to surround the plurality of through-holes of the insulating substrate.

13. The camera device of claim 12, wherein: wires connected to the image sensor are connected to some of the plurality of first metal pads; and the at least some of the through-holes of the insulating substrate are filled with a conductive material.

14. The camera device of claim 12, further comprising a solder resist layer disposed between the insulating substrate and the image sensor, wherein the solder resist layer is disposed to cover some of the plurality of first metal pads.

15. The camera device of claim 12, wherein: a plurality of third metal pads are disposed on the printed circuit board; and at least some of the plurality of second metal pads are connected to at least some of the plurality of third metal pads.

16. The camera device of claim 15, wherein the solder layer is disposed between at least some of the plurality of second metal pads and at least some of the plurality of third metal pads.

17. The camera device of claim 11, wherein: a cavity is formed in the printed circuit board; and the insulating substrate and the image sensor are accommodated in the cavity.

18. The camera device of claim 17, further comprising a molding layer which fixes the printed circuit board, the insulating substrate, and the image sensor in the cavity.

\* \* \* \* \*